United States Patent
Hegde

(10) Patent No.: US 9,076,783 B2
(45) Date of Patent: Jul. 7, 2015

(54) METHODS AND SYSTEMS FOR SELECTIVELY FORMING METAL LAYERS ON LEAD FRAMES AFTER DIE ATTACHMENT

(71) Applicant: Rama I. Hegde, Austin, TX (US)

(72) Inventor: Rama I. Hegde, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/849,460

(22) Filed: Mar. 22, 2013

(65) Prior Publication Data

US 2014/0284778 A1 Sep. 25, 2014

(51) Int. Cl.
*H01L 23/495* (2006.01)

(52) U.S. Cl.
CPC ... *H01L 23/49582* (2013.01); *H01L 2924/0002* (2013.01); *H01L 23/49503* (2013.01); *H01L 23/49537* (2013.01)

(58) Field of Classification Search
CPC .............. H01L 23/495; H01L 23/4951; H01L 23/49527; H01L 23/52; H01L 21/58; H01L 21/60
USPC .......... 438/106–127; 257/666–675, 781–782, 257/750
See application file for complete search history.

(56) References Cited

U.S. PATENT DOCUMENTS

| | | | |
|---|---|---|---|
| 4,367,123 A | 1/1983 | Beck | |
| 5,527,740 A * | 6/1996 | Golwalkar et al. | 29/827 |
| 5,534,314 A | 7/1996 | Wadley et al. | |
| 7,030,469 B2 | 4/2006 | Mahadevan et al. | |
| 7,227,245 B1 * | 6/2007 | Bayan et al. | 257/666 |
| 7,528,006 B2 * | 5/2009 | Arana et al. | 438/106 |
| 7,619,303 B2 * | 11/2009 | Bayan | 257/666 |
| 8,105,932 B2 * | 1/2012 | Ong et al. | 438/612 |
| 8,114,706 B2 * | 2/2012 | Kudoh et al. | 438/106 |
| 8,283,758 B2 * | 10/2012 | Jiang | 257/673 |
| 8,945,990 B2 * | 2/2015 | Torwesten et al. | 438/118 |
| 2003/0011048 A1 * | 1/2003 | Abbott et al. | 257/666 |
| 2008/0061414 A1 * | 3/2008 | Retuta et al. | 257/676 |
| 2009/0302476 A1 * | 12/2009 | Li | 257/767 |
| 2010/0308448 A1 * | 12/2010 | Murakami | 257/676 |
| 2011/0140253 A1 | 6/2011 | Lee et al. | |

OTHER PUBLICATIONS

Gorski et al., "Jet Vapor Deposition", Solid State Technology, 6 pgs (Feb. 1, 2003).

(Continued)

*Primary Examiner* — Evan Pert
*Assistant Examiner* — Herve Assouman
(74) *Attorney, Agent, or Firm* — Egan, Peterman, & Enders LLP

(57) ABSTRACT

Methods and systems are disclosed for selectively forming metal layers on lead frames after die attachment to improve electrical connections for areas of interest on lead frames, such as for example, lead fingers and down-bond areas. By selectively forming metal layers on areas of interest after die attachment, the disclosed embodiments help to eliminate anomalies and associated defects for the lead frames that may be caused by the die attachment process. A variety of techniques can be utilized for selectively forming one or more metal layers, and a variety of metal materials can be used (e.g., nickel, palladium, gold, silver, etc.). Further, cleaning can also be performed with respect to the areas of interest prior to selectively forming the one or more metal layers on areas of interest for the leaf frame.

11 Claims, 5 Drawing Sheets

(56) References Cited

OTHER PUBLICATIONS

Siah et al., "Silver Spot Plating Technique", Proceedings of the 4$^{th}$ Mechanical Engineering Research Colloquium, 8 pgs (Jan. 2005).

Dunn et al., "Thermosonic Gold Ball Bonding to Immersion Gold/Electroless Nickel Plating Finishes on Laminate MCM Substrates", 9 pgs (1997).

Picosun And Carleton University Introduce The First Godl Films by Plasma-Enhanced Ald, Press Release, 1 pg (Jul. 2011).

"Quad Flat Pack No-Lead (QFN) Micro Dual Flat Pack No-Lead (uDFN)", Freescale Semiconductor, Application Note, AN1902, 32 pgs (Sep. 2008).

"Power Quad Flat No-Lead (PQFN) Package", Freescale Semiconductor, Application Note, 16 pgs (Apr. 2007).

\* cited by examiner

METHODS AND SYSTEMS FOR SELECTIVELY FORMING METAL LAYERS ON LEAD FRAMES AFTER DIE ATTACHMENT

TECHNICAL FIELD

This technical field relates to lead frame processing and, more particularly, to metal plating on lead frames that are used to improve electrical connections.

BACKGROUND

Integrated circuit (IC) devices are often fabricated in large numbers on a semiconductor substrate, such as a semiconductor wafer. Once fabrication is completed, the semiconductor substrate (e.g., wafer) is cut so that the individual IC devices are singulated into individual dies with each die including an IC device. For example, a large number of microcontroller IC devices can be fabricated on a semiconductor wafer and then singulated into individual dies with each die having one of the microcontroller IC devices. Once singulated, the dies are often included within an IC package. One technique for providing electrical connections to dies within a semiconductor device packages is through the use of lead frames.

A wide variety of lead frame implementations have been used. In general, a lead frame can be thought of as a mechanical support structure for the die within the IC package that also provides electrical connections to and from the die. A lead frame will typically include a die-attach area where the die is attached to the lead frame, and the lead frame will typically include one or more lead fingers and may also include a down-bond area. The lead fingers are often utilized to provide electrical connections between the die and circuitry that will be external to the semiconductor package. Down-bond areas are often used for connections that are internal to the semiconductor package. In some lead frame solutions, a wire bonding process is used to attach wires from the lead fingers and/or down-bond areas to bond pads and/or sites on the die. If desired, other electrical connection techniques can also be used (e.g., solder bumps). The lead frame and die assembly, including electrical connections, are ultimately mounted within a completed IC package. Further, for some IC packages, multiple dies may be included using one or more lead frames to facilitate mechanical support and electrical connections. Still further, it is noted that lead frames can be encapsulated in no-lead packages that have no external leads.

Lead frames are often provided by lead frame manufacturers to another assembler or manufacturer who then attaches dies to the lead frames and adds electrical connections, such as through a wire bonding process. To help improve the electrical connections that will ultimately be made between the die and the lead frame, lead frame manufacturers typically add metal plating to lead fingers and down-bond areas on the lead frames. This metal plating can use a variety of metals, and gold and/or silver plating is a common technique. As such, the lead frame will typically be pre-plated with gold, silver, and/or another metal when the lead frame is provided to the entity that performs the die attachment.

FIG. 1 (Prior Art) is a block diagram of an embodiment 100 representing a pre-plated lead frame. The pre-plated lead frame embodiment 100 depicted includes a lead frame support structure 102, which further includes a die-attach area 104. A plurality of lead fingers 108 are also coupled to the lead frame support structure 102. Further, the block 106 represents a down-bond area where a down-bond connection will later be made. As described above and represented by the "P" labels in embodiment 100, the lead fingers 108 and the down-bond area 106 have been pre-plated (e.g., gold plating, silver plating) to improve later electrical connections that will be made after die attachment.

FIG. 2 (Prior Art) is an embodiment 200 of a side-view of the pre-plated lead frame of FIG. 1 (Prior Art). For the embodiment 200 depicted, lead fingers 108 include a base material 202 and a plating material 204. The down-bond area 106 can include the same plating material 204. For example, gold plating or silver plating can be used to form the plating material 204. The completed lead frame, therefore, includes pre-plating of the expected electrical connection points, such as lead fingers 108 and down-bond area 106, that will be used after die-attach processing for making electrical connections.

FIG. 3 (Prior Art) is an embodiment 300 for example materials within a pre-plated portion of a lead frame. For the embodiment 300 depicted, the underlying support material for the lead frame is a copper (Cu) alloy 302. To pre-plate areas of interest for the lead frame, such as lead fingers 108 and down-bond area 106, additional metal layers are provided, such as layers 304 and 306, followed by a final metal plating layer 308. As depicted, nickel (Ni) is used for metal layer 304. Palladium (Pd) is used for metal layer 306. And gold (Au) is used for the final pre-plating metal layer 308. Silver (Ag) or another desired material could also be utilized as the final pre-plating metal layer 308, if desired.

While metal plating areas of interest on pre-plated lead frames, such as pre-plated lead fingers and pre-plated down-bond areas, can provided improved electrical connections, any anomalies and associated defects (e.g., delaminating of metal plating, non-stick of metal plating on lead, contamination of metal plating areas, or other defects) associated with these pre-plated areas of interest can cause device performance degradation or failure.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale FIG. 1 (Prior Art) is a block diagram of an embodiment representing a pre-plated lead frame.

DETAILED DESCRIPTION

Methods and systems are disclosed for selectively forming metal layers on lead frames after die attachment to improve electrical connections for areas of interest on lead frames, such as for example, lead fingers and down-bond areas. As described herein, a variety of different features and variations can be implemented, as desired, and related or modified systems and methods can be utilized, as well.

As indicated above, any anomalies and associated defects (e.g., delaminating of metal plating, non-stick of metal plating on lead, contamination of metal plating areas, or other defects) associated with pre-plated areas of interest on pre-plated lead frames can cause device performance degradation or failure. It has been determined that the die attachment process can contribute to and/or cause such anomalies and associated defects. For example, the die attachment process can cause contaminants to form on the surface of the lead frame including areas of interest for electrical connections, such as lead fingers and down-bond areas. Further, pre-plated metal (e.g., gold plating, silver plating) can delaminate or otherwise be removed through the die attachment process. Issues can arise in a variety of lead frame package types, including QFP (quad flat pack) packaging, QFN (quad flat no-lead) packaging, SOIC (small outline integrated circuit) packaging, PQFN (power quad flat no-lead) packaging, and/or other lead frame package types.

As described herein, metal layers are selectively formed on local areas of interest for lead frames after die attachment thereby helping to eliminate anomalies and associated defects that may be caused by the die attachment process. As further described herein, a variety of techniques can be utilized for the selectively forming one or more metal layers, as desired. Further, a variety materials can be utilized to form the one or more metal layers (e.g., nickel, palladium, gold, silver, etc.), as desired. Still further, cleaning can also be performed with respect to the local areas of interest prior to selectively forming the metal layers on the areas of interest, if desired. Other variations could also be implemented, if desired, while still utilizing the selective plating of lead frames after die attachment, as described herein.

Figure 1:
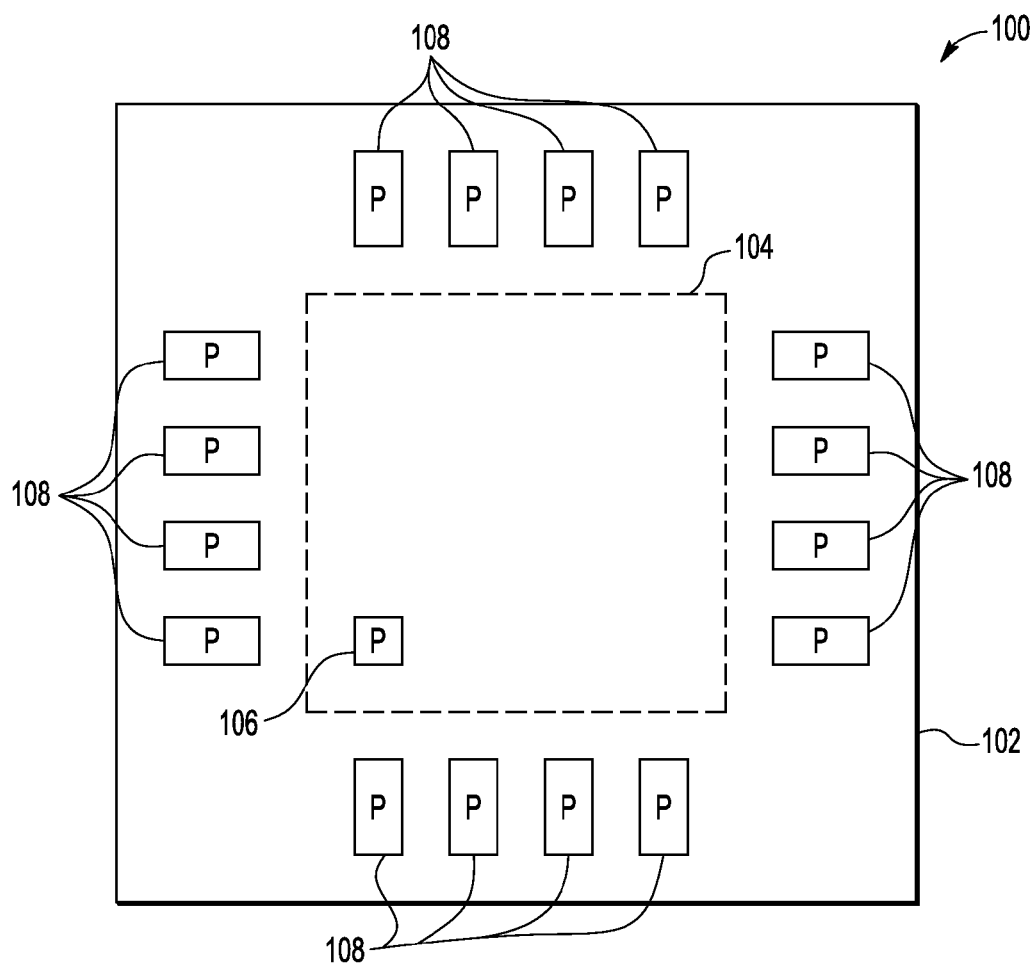
Figure 4:
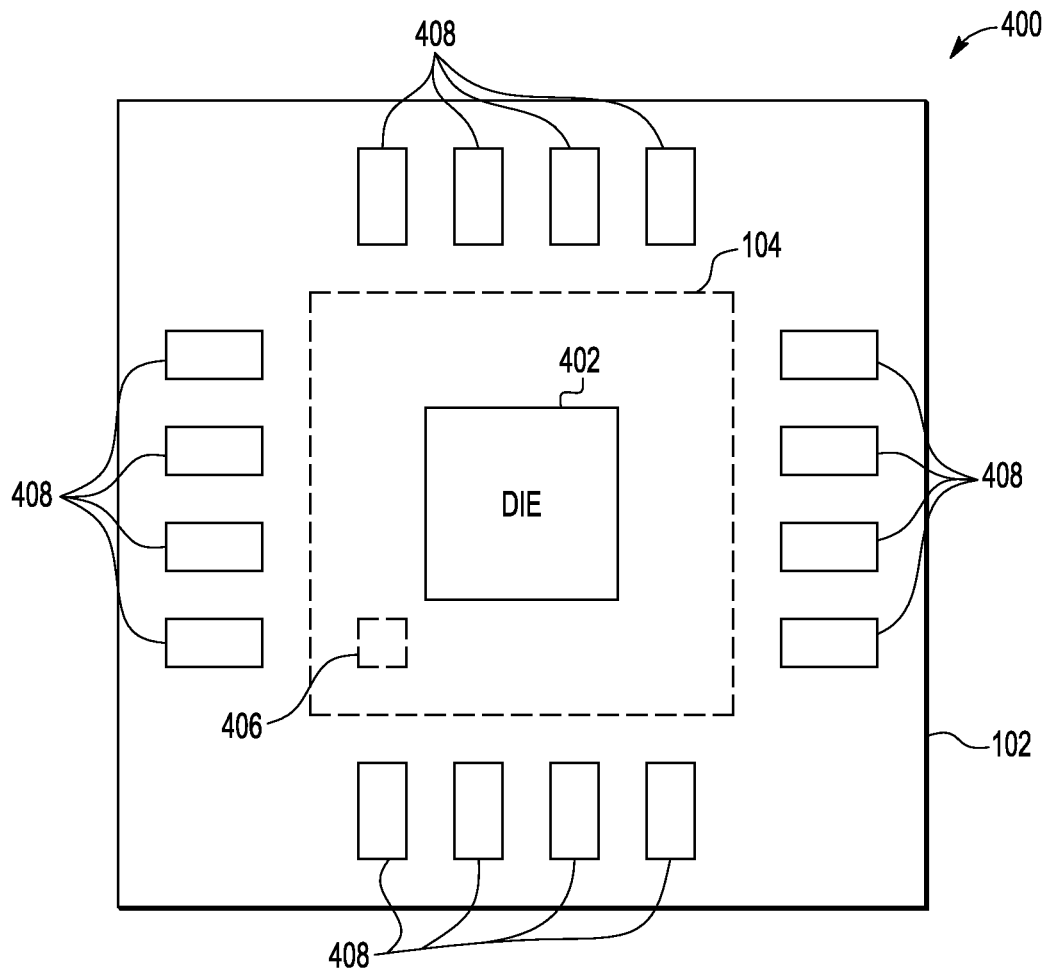
FIG. 4 is a block diagram of an embodiment representing an un-plated lead frame where plating is performed after die attachment.

FIG. 4 is a block diagram of an embodiment 400 representing a lead frame where metal plating is performed after die attachment. The un-plated lead frame embodiment 400 depicted includes a lead frame support structure 102, which further includes a die-attach area 104. For embodiment 400, a die 402 has already been attached to the lead frame support structure 102 within the die-attach area 104. A plurality of lead fingers 408 are also coupled to the lead frame support structure 102. Further, the block 406 represents an example down-bond area where a down-bond connection will later be made. Unlike embodiment 100 of FIG. 1 (Prior Art), however, the lead fingers 408 and the down-bond area 406 have not been pre-plated.

It is noted that particular implementations for the lead frame 102 and related structures will vary depending upon the particular lead frame solution implemented. For example, stamped or etched copper alloy material can be used to form lead frames where the lead frame support structure 102 includes a die-attach area 104 and copper alloy connectors coupled to the lead fingers 408 and other structures. Other conductive and/or non-conductive materials, or a combination of conductive and non-conductive materials, could also be utilized for the lead frame, as desired. For example, a dielectric substrate could be utilized for the lead frame structure, if desired. Further, a plurality of lead frames are often coupled together in strips or arrays for die attachment. The lead frames can then be singulated after die attachment processing and/or other further processing steps. It is further noted that any desired lead frame implementation can be utilized, as desired, with respect to the embodiments described herein where metal layers are selectively formed after die attachment on one or more areas of interest for the lead frame. For example, lead frame package types that could be utilized include QFP (quad flat pack) packaging, QFN (quad flat no-lead) packaging, SOIC (small outline integrated circuit) packaging, PQFN (power quad flat no-lead) packaging, and/or other desired lead frame package types. In addition, it is noted that pre-plating could be applied to some areas of the lead frame prior to die attachment, if desired, while still taking advantage of the embodiments described herein that add selective metal layers to areas of interest of the lead frame (e.g., lead fingers and down-bond areas) after die attachment.

Figure 2:
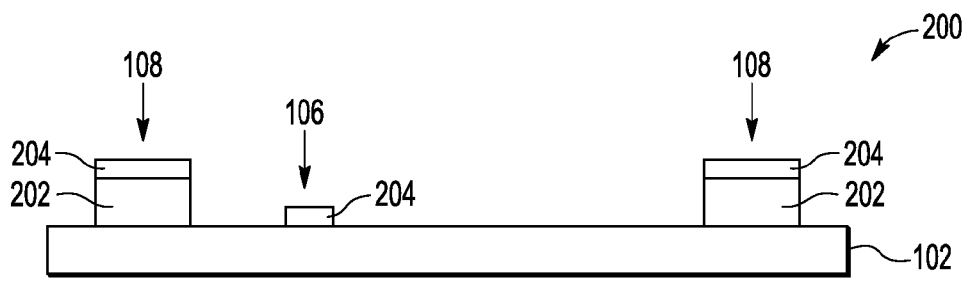
FIG. 2 (Prior Art) is a side-view of the pre-plated lead frame of FIG. 1 (Prior Art).
Figure 5:
FIG. 5 is a side-view of the un-plated lead frame of FIG. 4 prior to die attachment.

FIG. 5 is a side-view embodiment 500 for the un-plated lead frame of FIG. 4 prior to attachment of the die 402. For the embodiment depicted, lead fingers 408 include a base material 502 but do not include the top level metal-plating layer 204 shown in FIG. 2 (Prior Art). The down-bond area 406 also does not include the top level metal-plating layer 204 shown in FIG. 2 (Prior Art). As such, the completed lead frame prior to die attachment is not pre-plated.

Figure 6:
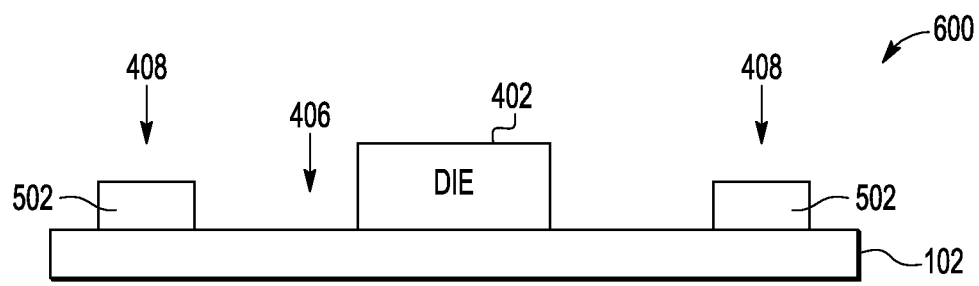
FIG. 6 is a side-view of the un-plated lead frame of FIG. 4 after die attachment.

FIG. 6 is a side-view embodiment 600 for the un-plated lead frame of FIG. 4 after attachment of the die 402. As shown, die attachment has been performed to couple the die 402 to the lead frame support structure 102. However, lead fingers 408 and down-bond area 406 still do not include the top level metal-plating layer 204 shown in FIG. 2 (Prior Art). It is noted that the die attachment process may be implemented, for example, using solder paste processing steps along with associated reflow and flux clean processing steps. Other die attachment processing techniques could also be utilized, as desired.

Figure 3:
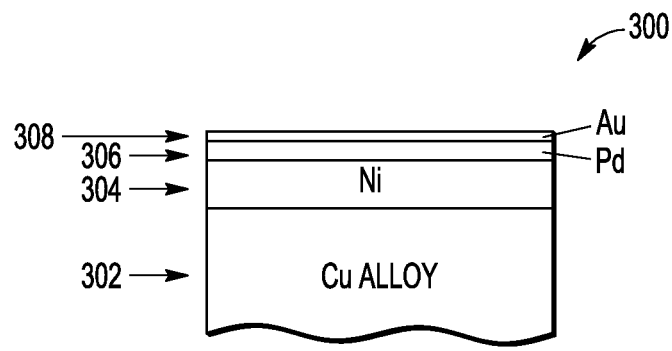
FIG. 3 (Prior Art) is an embodiment for example materials within a pre-plated lead frame.
Figure 7:
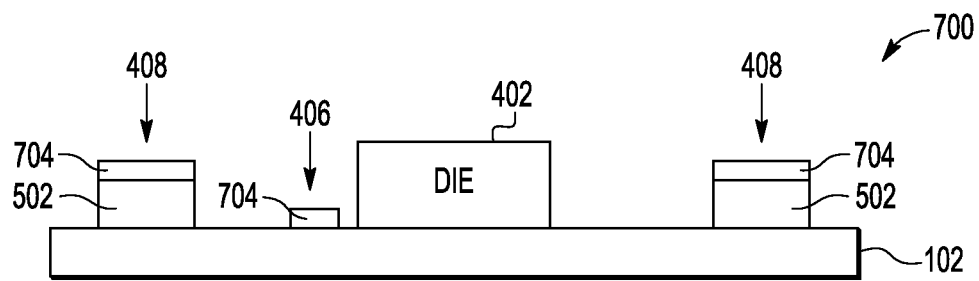
FIG. 7 is a side-view of an embodiment of a lead frame where selective metal plating has been performed after die attachment.

FIG. 7 is an embodiment 700 of a side-view of a lead frame where selective metal plating has been performed after die attachment. As shown, the lead fingers 408 and the down-bond area 406 include a metal layer 704. For example, gold can be used to form the material layer 704. Silver or another material could also be utilized as the final metal layer 704, if desired. Further, as with embodiment 300 in FIG. 3 (Prior Art), it is noted that one or more additional metals and metal layers can be used for the base material 502, as desired. For example, the lead frame support structure 102 can be a copper alloy, and the metal layers can include a nickel layer, a palladium layer, and a top gold and/or silver layer. Other variations could also be implemented, as desired.

It is noted that the selective metal plating can include one or more metal layers, and the selective metal plating can be implemented utilizing a variety of technique, as desired. For example, vapor jet deposition (VJD) and/or atomic layer deposition (ALD) processing techniques can be utilized to selectively form metal layers on areas of interest for the lead frames. Other processing techniques could also be utilized, if desired.

With respect to VJD processing, it is noted that the VJD process produces a collimated flow of metal that can allow selective metal plating of local areas of interest on lead frames, such as lead fingers and down-bond areas. VJD employs a sonic jet produced by a nozzle-shaped source having an exit hole. A flow of carrier gas is supplied to the nozzle and is sustained by a mechanical, downstream pump. A hot filament then vaporizes the source metal (e.g., gold, silver, etc.) in a stream of argon. The nozzle accelerates the gas to sonic speed, transporting a collimated flow of metal onto the area of interest. It is noted that the VJD processing can be conducted at a relatively low temperature and pressure. It is further noted that VJD processing may be particularly useful for selective metal plating of lead fingers for lead frames, although other areas of interest can also be plated using VJD processing, as well. Other processing techniques that utilize a collimated flow of metal could also be utilized, if desired.

With respect to ALD processing, it is noted that the ALD process can utilize a carrier gas, a precursor, and a reactant. For example, gold halide precursors can be utilized along with a hydrogen reactant. The gold halide is pulsed into a deposition chamber containing the lead frame, and un-reacted halide gas can be purged using nitrogen gas. Hydrogen gas is also pulsed into the deposition chamber, and again un-reacted halide gas can be purged using nitrogen gas. Gold is released and deposited through reaction of the gold halide precursor with the hydrogen reactant. Silver or another desired material could also be utilized, if desired. The deposition temperature can be about 50 to 150 degrees Celsius, and the ALD processing can be repeated until the desired film thickness is reached. It is noted that patterning and etch steps can be used to protect and expose desired areas of the lead frame to provide for selective deposition of metal layers on areas of interest using the ALD processing. It is further noted that ALD processing may be particularly useful for selective metal plating of down-bond areas for lead frames, although other areas of interest can also be plated using ALD processing, as well. Other atomic layer deposition processing techniques could also be utilized, if desired.

Figure 8:
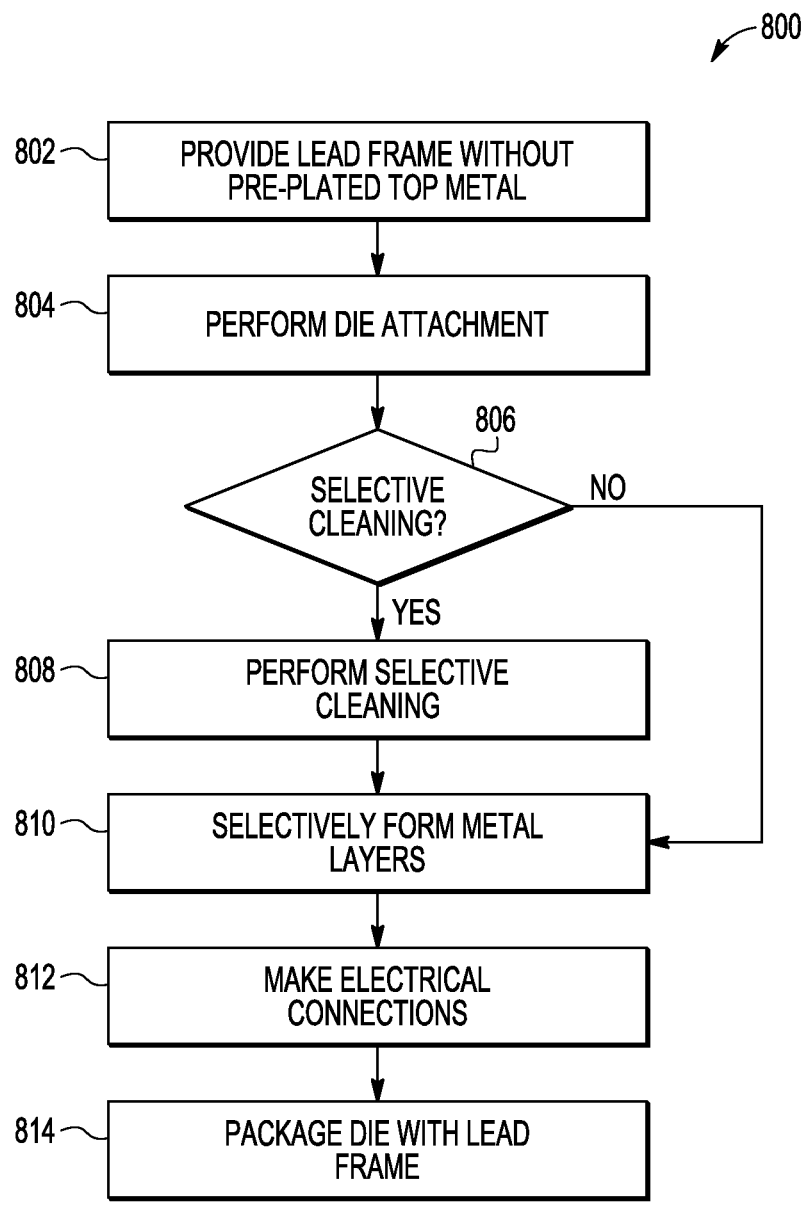
FIG. 8 is a process flow diagram of an embodiment for applying selective metal plating to a lead frame after die attachment.

FIG. 8 is a process flow diagram of an embodiment 800 for selective forming metal layers on areas of interest for a lead frame after die attachment. In block 802 a lead frame is provided without a pre-plated top metal layer for areas of interest, such as lead fingers and/or down-bond areas. In block 804 die attachment is performed to couple the die to the lead frame. In block 806, a determination is made whether selective cleaning is desired. If "NO," then flow passes to block 810. If "YES," then flow passes to block 808 where selective cleaning is performed with respect to the areas of interest for the lead frame, such as lead fingers and/or down-bond areas, where metal layers will be added. Further, if desired, the cleaning can be non-selective such that the cleaning is applied more generally to the lead frame and die structure. In block 810, one or more metal layers are selectively formed on areas of interest for the lead frame, such as lead fingers and/or down-bond areas, where improvement to electrical connections is desired. In block 812, electrical connections are made to the areas of interest where selective metal layers were formed. In block 814, the die is packaged with the lead frame in a desired semiconductor package. It is further noted that a variety of additional processing steps may be included, if desired, in addition to those shown for embodiment 800 in FIG. 8. For example, additional processing steps may be included between the selective formation of metal layers in block 810 and the formation of electrical connections (e.g., through wire bonding) in block 812 and/or the packaging of the die and lead frame in block 814. Further, it is again noted that that some pre-plating could be applied to the lead frame prior to die attachment, if desired, while still taking advantage of the embodiments described herein that add selective metal layers to areas of interest of the lead frame (e.g., lead fingers and down-bond areas) after die attachment. Other variations could also be implemented, as desired.

It is noted that the selective cleaning of areas of interest, if implemented, can be performed using a variety of processing techniques, as desired. For example, selective cleaning of an area of interest for the lead frame may be implemented using plasma and/or ion bombardment to clean the area of interest. With respect to ion bombardment, it is noted that argon ion bombardment could be used to provide selective sputter (dry) etch processing of the area of interest, thereby removing contaminants, such as tin, lead, and/or other contaminants. For example, argon ion bombardment having electron energies of 1 to 3 keV could be utilized with an argon pressure of about $10^{-6}$ to $10^{-7}$ Torr at room temperature, if desired. It is further again noted that the cleaning could be non-selective such that the cleaning is applied more generally to the lead frame and die structure. Other variations and cleaning techniques could also be implemented, as desired.

It is further noted that the selective metal plating of the lead frame after die attachment, as described herein, can be implemented within with or without exposing the lead frame and die to ambient air. Further, it is noted that the cleaning of the areas of interest prior to selective metal plating, if implemented, can be performed in the same chamber as the selective metal plating, if desired. The cleaning, however, could also be implemented in a separate chamber from the selective metal plating, if desired. Other variations could also be implemented, as desired.

Figure 9:
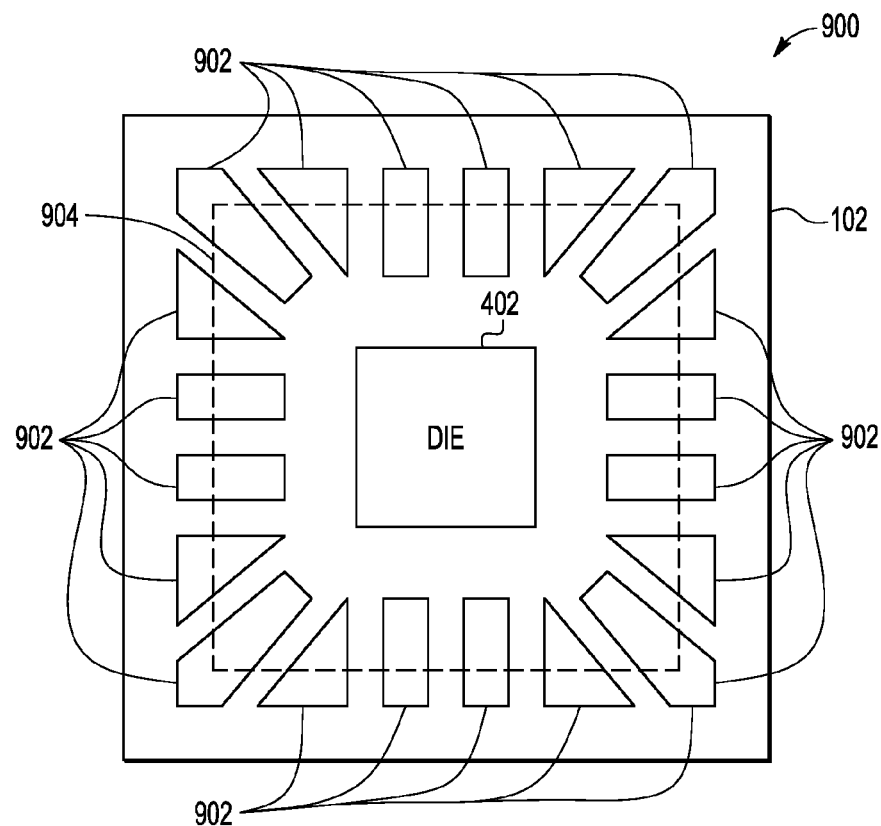
FIG. 9 is an embodiment for a lead frame having open regions for forming lead fingers.
Figure 10:
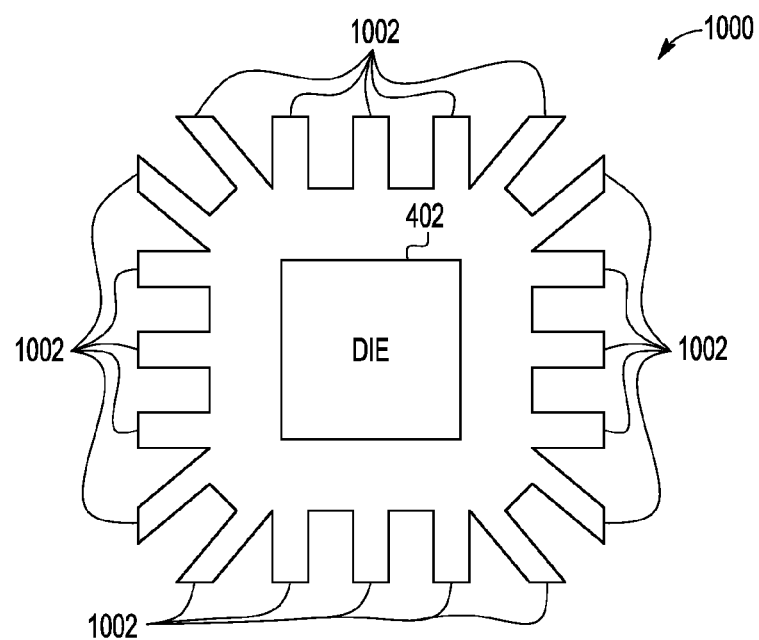
FIG. 10 is an embodiment for a lead frame after a cut has been made to form lead fingers.

As indicated above, any desired lead frame structure could be utilized with respect to the embodiments described herein that selective form metal layers after die attachment to the lead frame. For example, a lead frame can be utilized that includes open regions that are used to form lead fingers after processing through a separation process. FIGS. 9 and 10 provide an example of such an embodiment. Other lead frame variations could also be utilized, as desired.

FIG. 9 is an embodiment 900 for a lead frame 102 having open regions 902 for forming lead fingers. As depicted, a die 402 is attached to a lead frame 102. The regions 902 represent open regions that are used to form lead fingers after the die 102 is separated along dashed line 904 that form a box around the die 102. The separation along dashed line 904 can be implemented, for example, using a laser cutting or stamping process that effectively cuts the lead frame 102 along the dashed line 902.

FIG. 10 is an embodiment 1000 for a lead frame 102 after a cut has been made along dashed line 904 in FIG. 9 to form lead fingers 1002. As indicated above, separation along dashed line 904 can be implemented, for example, using a laser cutting or stamping process that effectively cuts the lead frame 102 along the dashed line 902. It is noted that after die attachment metal layers could be formed either before and/or after the separation along dashed line 904, as desired. Further, other processing steps could also be implemented, as desired, either before and/or after the separation along dashed line 904. Other variations could also be implemented, as desired.

As described herein, a variety of embodiments can be implemented and different features and variations can be implemented, as desired.

In one embodiment, a method is disclosed for making an integrated circuit package including attaching a die to a lead frame and, after attaching the die, selectively forming at least one metal layer on at least one area of interest for the lead frame, where the die includes integrated circuits and where the at least one area of interest is configured for an electrical connection.

In other embodiments, the at least one area of interest includes at least one lead finger for the lead frame. In further embodiments, the at least one area of interest includes at least one down-bond area for the lead frame. Still further, the at least one metal layer can include at least one of gold or silver. In addition, the selectively forming step can include selectively forming a plurality of metal layers on at least one area of interest for the lead frame. Still further, the lead frame can include a copper alloy. In addition, the lead frame can be configured for at least one of QFP (quad flat pack) packaging, QFN (quad flat no-lead) packaging, SOIC (small outline integrated circuit) packaging, or PQFN (power quad flat no-lead) packaging.

In additional embodiments, the method includes utilizing vapor jet deposition to perform the selective forming step. The method can also include utilizing atomic layer deposition to perform the selective forming step. Still further, the method can include cleaning the at least one area of interest prior to the selectively forming step. In addition, the method can include utilizing ion bombardment to perform the cleaning step. The method can also include forming an electrical connection to the at least one area of interest. Further, the method can include utilizing wire bonding to perform the forming step.

In one further embodiment, an assembly is disclosed including a lead frame having at least one area of interest, a die attached to the lead frame, and at least one metal layer formed on the at least one area of interest, where the at least one area of interest is configured to provide an electrical connection and where the at least one metal layer is configured to enhance the electrical connection and was formed after attachment of the die to the lead frame.

In other embodiments, the at least one area of interest includes at least one lead finger for the lead frame. In further embodiments, the at least one area of interest includes at least one down-bond area for the lead frame. Still further, the at least one metal layer can include at least one of gold or silver. In addition, the at least one metal layer can include a plurality of metal layers on at least one area of interest for the lead frame. The assembly can also include an electrical connection coupled to the at least one area of interest. In addition, the lead frame can be configured for at least one of QFP (quad flat pack) packaging, QFN (quad flat no-lead) packaging, SOIC (small outline integrated circuit) packaging, or PQFN (power quad flat no-lead) packaging.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A method for making an integrated circuit package, comprising
   attaching a die to a lead frame, the die comprising integrated circuits;
   after attaching the die, selectively forming at least one metal plating layer on at least one area of interest for the lead frame, the at least one area of interest being configured for an electrical connection, and the at least one metal plating layer comprising at least one of gold or silver; and
   after selectively forming the at least one metal plating layer, forming an electrical connection between the die and the metal plating layer for the at least one area of interest; and
   packaging the die, the lead frame, the at least one metal plating layer, and the electrical connection within a lead frame package.

2. The method of claim 1, wherein the at least one area of interest comprises at least one lead finger for the lead frame.

3. The method of claim 1, wherein the at least one area of interest comprises at least one down-bond area for the lead frame.

4. The method of claim 1, wherein the selectively forming step comprises selectively forming a plurality of metal plating layers on at least one area of interest for the lead frame.

5. The method of claim 1, further comprising utilizing vapor jet deposition to perform the selective forming step.

6. The method of claim 1, further comprising utilizing atomic layer deposition to perform the selective forming step.

7. The method of claim 1, further comprising cleaning the at least one area of interest prior to the selectively forming step.

8. The method of claim 7, further comprising utilizing ion bombardment to perform the cleaning step.

9. The method of claim 1, further comprising utilizing wire bonding to perform the forming step.

10. The method of claim 1, wherein the lead frame comprises a copper alloy.

11. The method of claim 1, wherein the lead frame package comprises at least one of QFP (quad flat pack) packaging, QFN (quad flat no-lead) packaging, SOIC (small outline integrated circuit) packaging, or PQFN (power quad flat no-lead) packaging.

* * * * *